(12) United States Patent
Su et al.

(10) Patent No.: US 9,659,946 B2
(45) Date of Patent: May 23, 2017

(54) SELF-ALIGNED SOURCE FOR SPLIT-GATE NON-VOLATILE MEMORY CELL

(71) Applicant: Silicon Storage Technology, Inc., San Jose, CA (US)

(72) Inventors: Chien-Sheng Su, Saratoga, CA (US); Jeng-Wei Yang, Zhubei (TW); Yueh-Hsin Chen, Pleasanton, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 15/287,672

(22) Filed: Oct. 6, 2016

(65) Prior Publication Data

US 2017/0025424 A1 Jan. 26, 2017

Related U.S. Application Data

(62) Division of application No. 14/319,893, filed on Jun. 30, 2014, now Pat. No. 9,484,261.

(60) Provisional application No. 61/843,189, filed on Jul. 5, 2013.

(51) Int. Cl.
*H01L 27/11521* (2017.01)
*H01L 29/423* (2006.01)
*H01L 29/66* (2006.01)
*H01L 29/16* (2006.01)

(52) U.S. Cl.
CPC .... *H01L 27/11521* (2013.01); *H01L 29/1608* (2013.01); *H01L 29/42328* (2013.01); *H01L 29/66825* (2013.01)

(58) Field of Classification Search
USPC .. 257/E21.409, E21.679, E21.682, E27.103, 257/E29.302, E29.309, 315, 316; 438/57, 438/786, 261, 287, 299, 586, 257, 264, 438/266, 267
See application file for complete search history.

(56) References Cited

U.S. PATENT DOCUMENTS

| | | |
|---|---|---|
| 7,927,994 B1 | 4/2011 | Liu et al. |
| 8,247,291 B2 | 8/2012 | Min et al. |
| 8,294,224 B2 | 10/2012 | Bhattacharyya et al. |
| 8,803,217 B2 | 8/2014 | Rao |
| 2006/0043482 A1 | 3/2006 | Burnett et al. |
| 2006/0079053 A1 | 4/2006 | Chen |

(Continued)

FOREIGN PATENT DOCUMENTS

| | | |
|---|---|---|
| JP | 11-163329 | 6/1999 |
| WO | 2008 112370 A1 | 9/2008 |

*Primary Examiner* — Telly Green
(74) *Attorney, Agent, or Firm* — DLA Piper LLP (US)

(57) ABSTRACT

A memory device having a pair of conductive floating gates with inner sidewalls facing each other, and disposed over and insulated from a substrate of first conductivity type. A pair of spaced apart conductive control gates each disposed over and insulated from one of the floating gates, and each including inner sidewalls facing each other. A pair of first spacers of insulation material extending along control gate inner sidewalls and over the floating gates. The floating gate inner sidewalls are aligned with side surfaces of the first spacers. A pair of second spacers of insulation material each extend along one of the first spacers and along one of the floating gate inner sidewalls. A trench formed into the substrate having sidewalls aligned with side surfaces of the second spacers. Silicon carbon disposed in the trench. Material implanted into the silicon carbon forming a first region having a second conductivity type.

5 Claims, 13 Drawing Sheets

(56) References Cited

U.S. PATENT DOCUMENTS

| | | |
|---|---|---|
| 2007/0238320 A1 | 10/2007 | Bhattacharyya et al. |
| 2009/0039410 A1 | 2/2009 | Liu et al. |
| 2011/0183505 A1 | 7/2011 | Min et al. |
| 2013/0045578 A1 | 2/2013 | Bhattacharyya et al. |
| 2013/0092954 A1 | 4/2013 | Yang et al. |

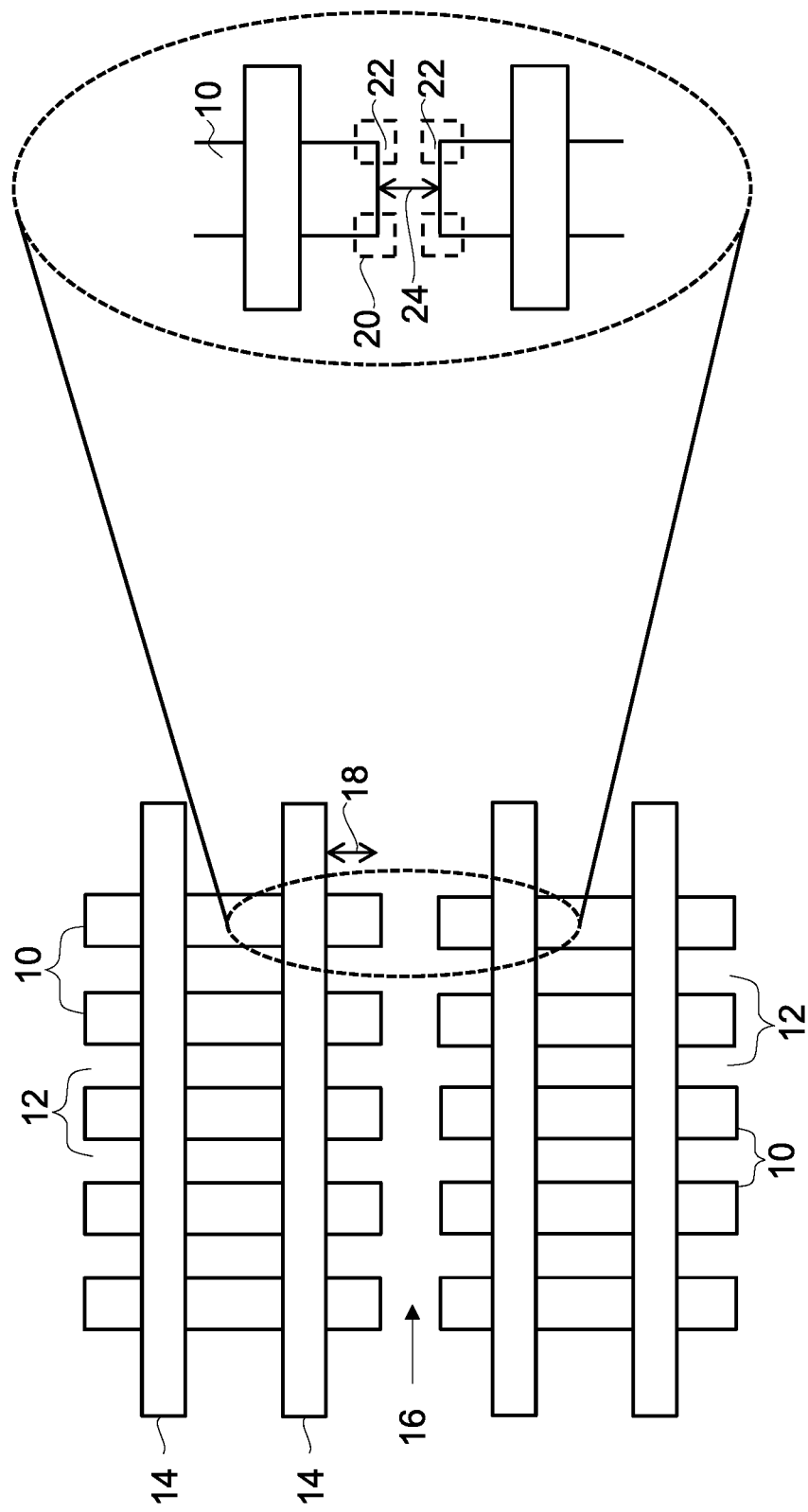

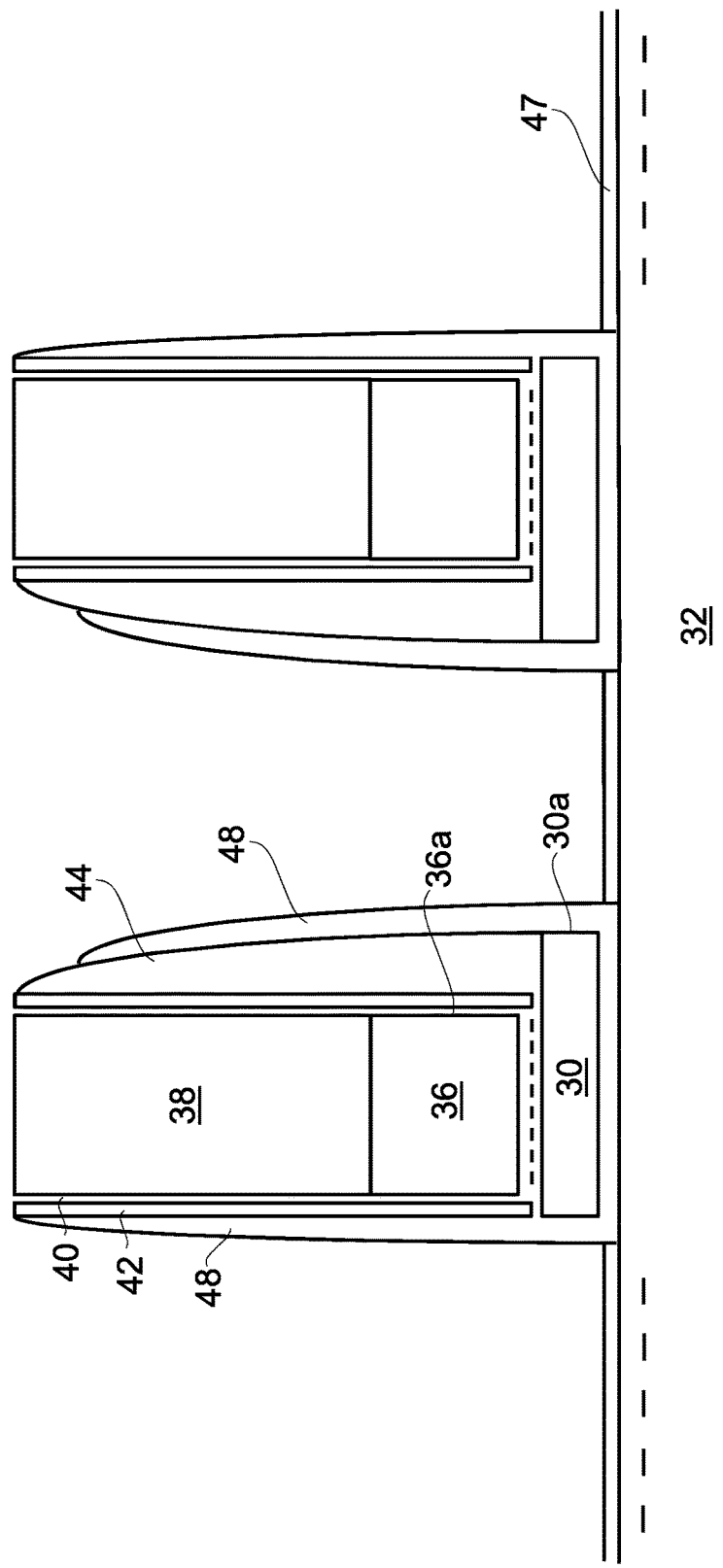

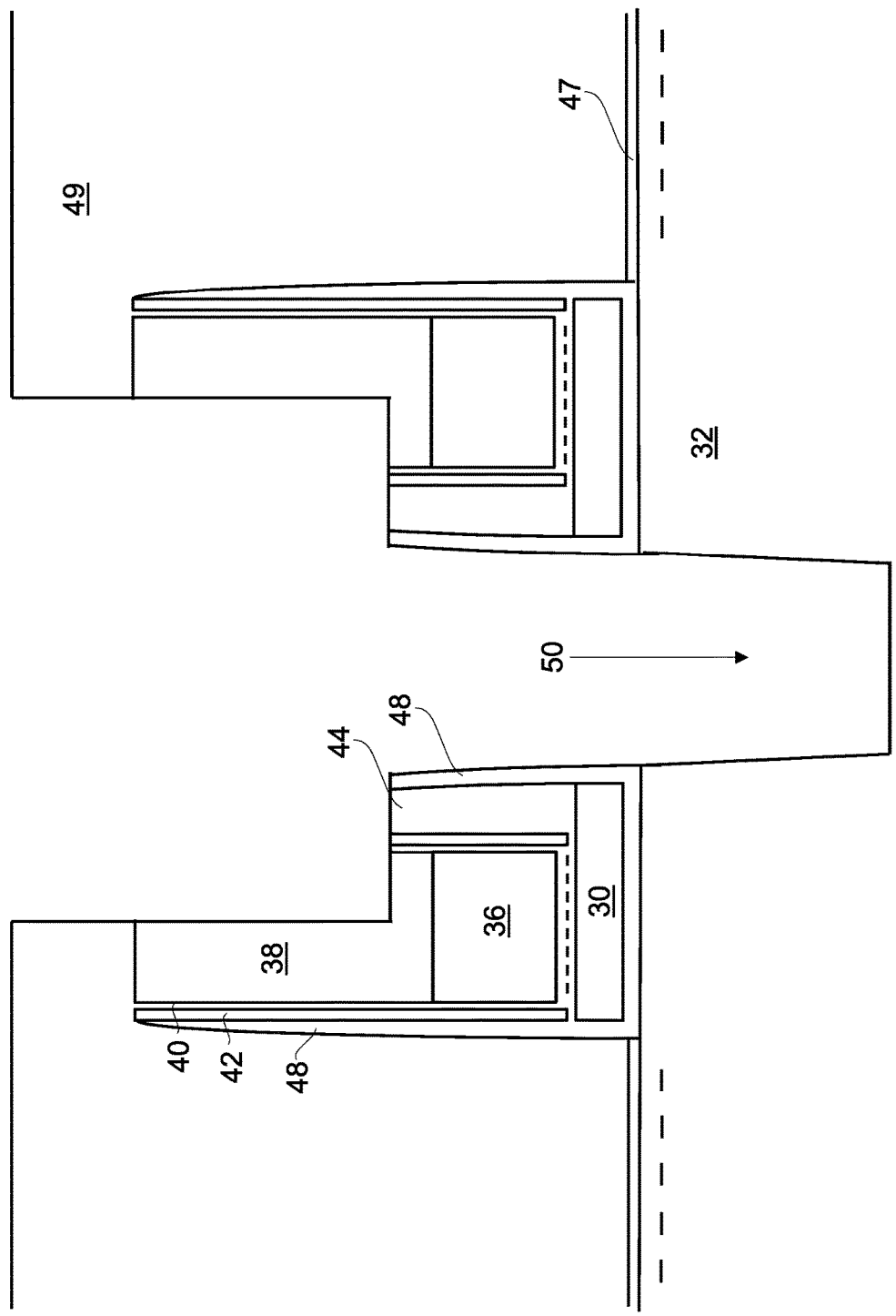

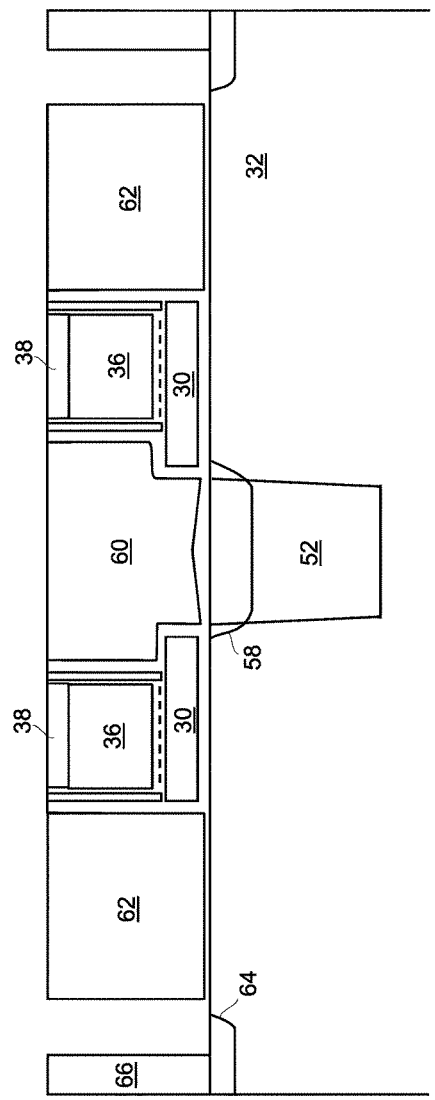

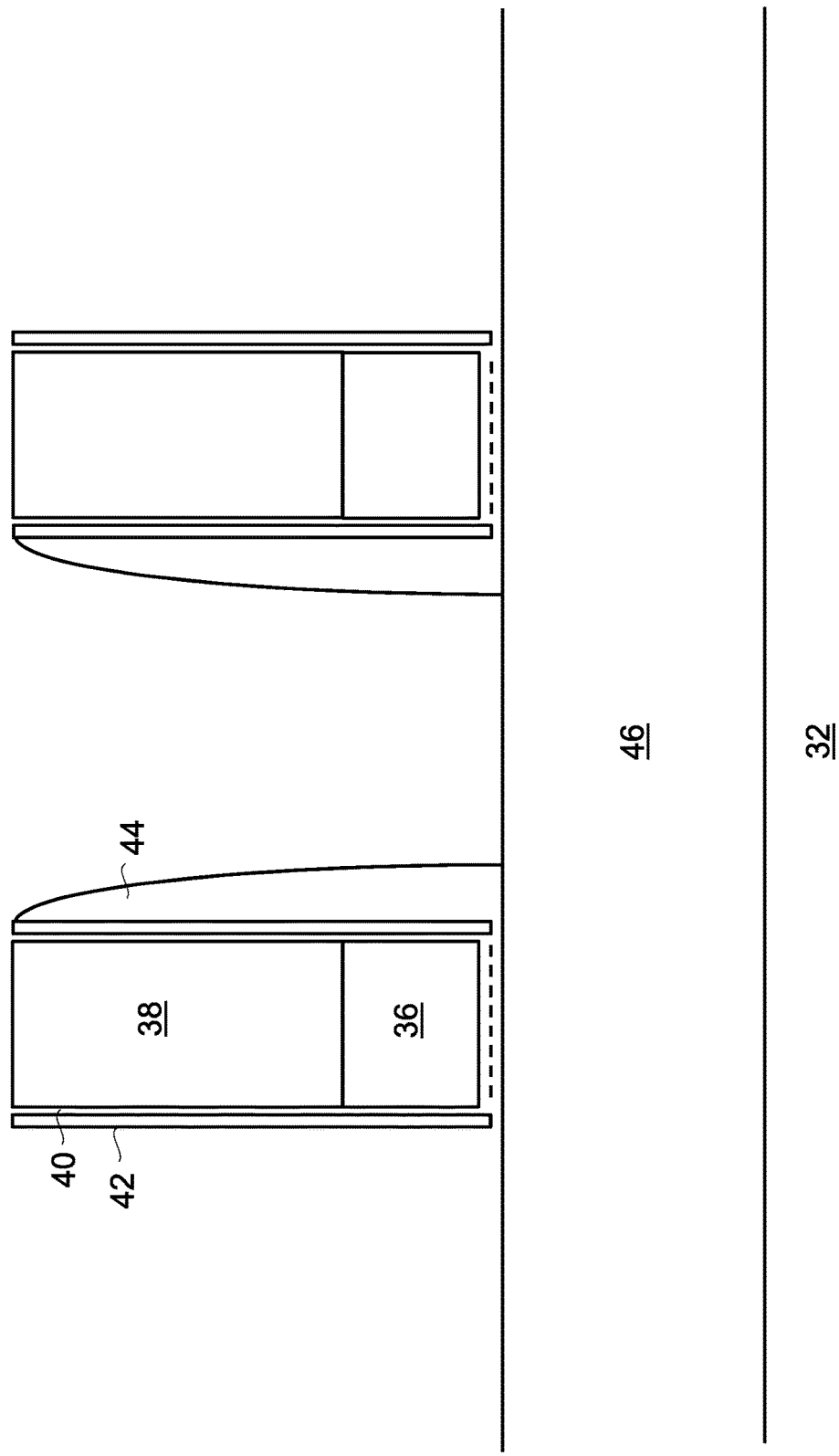

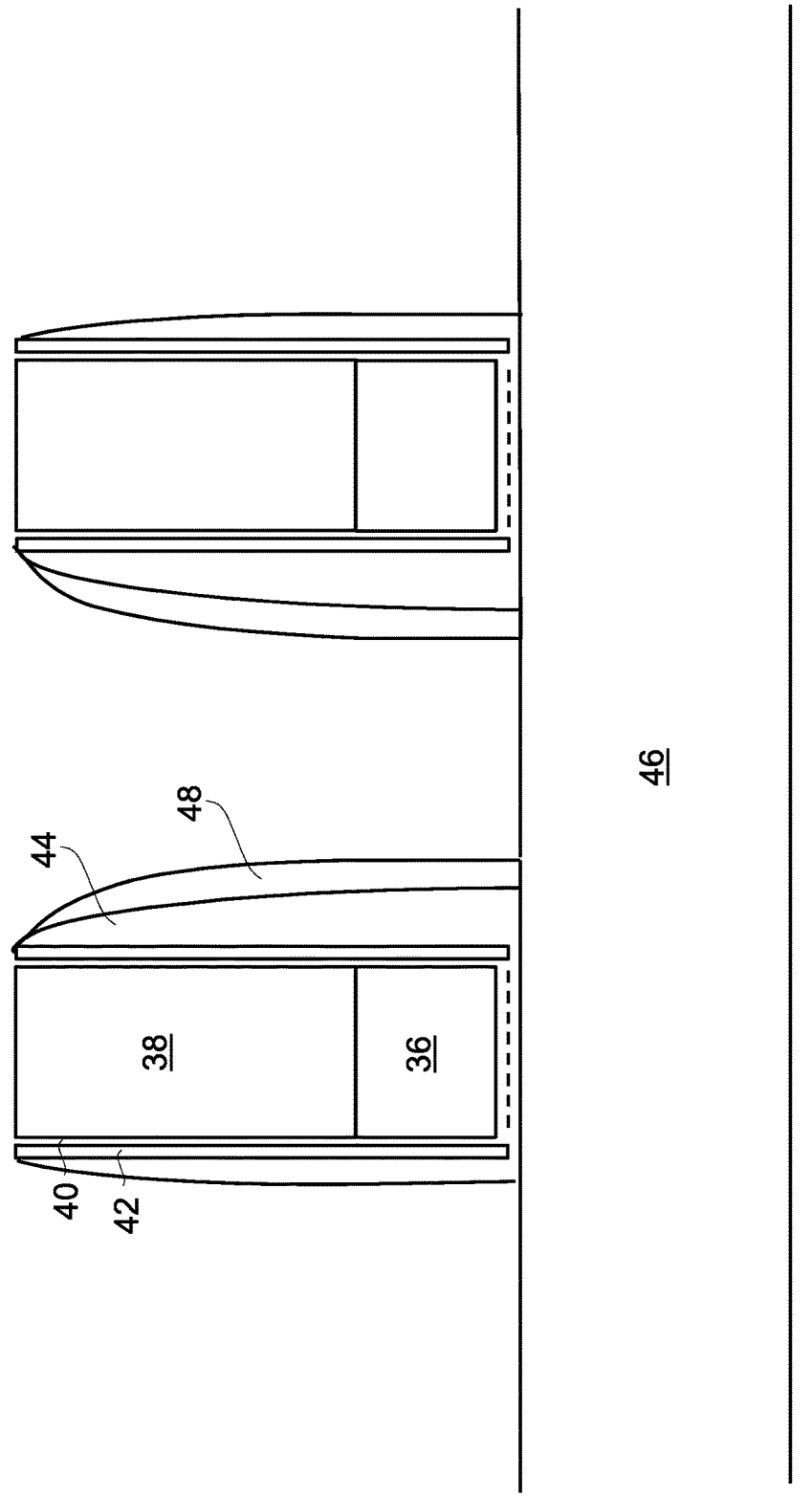

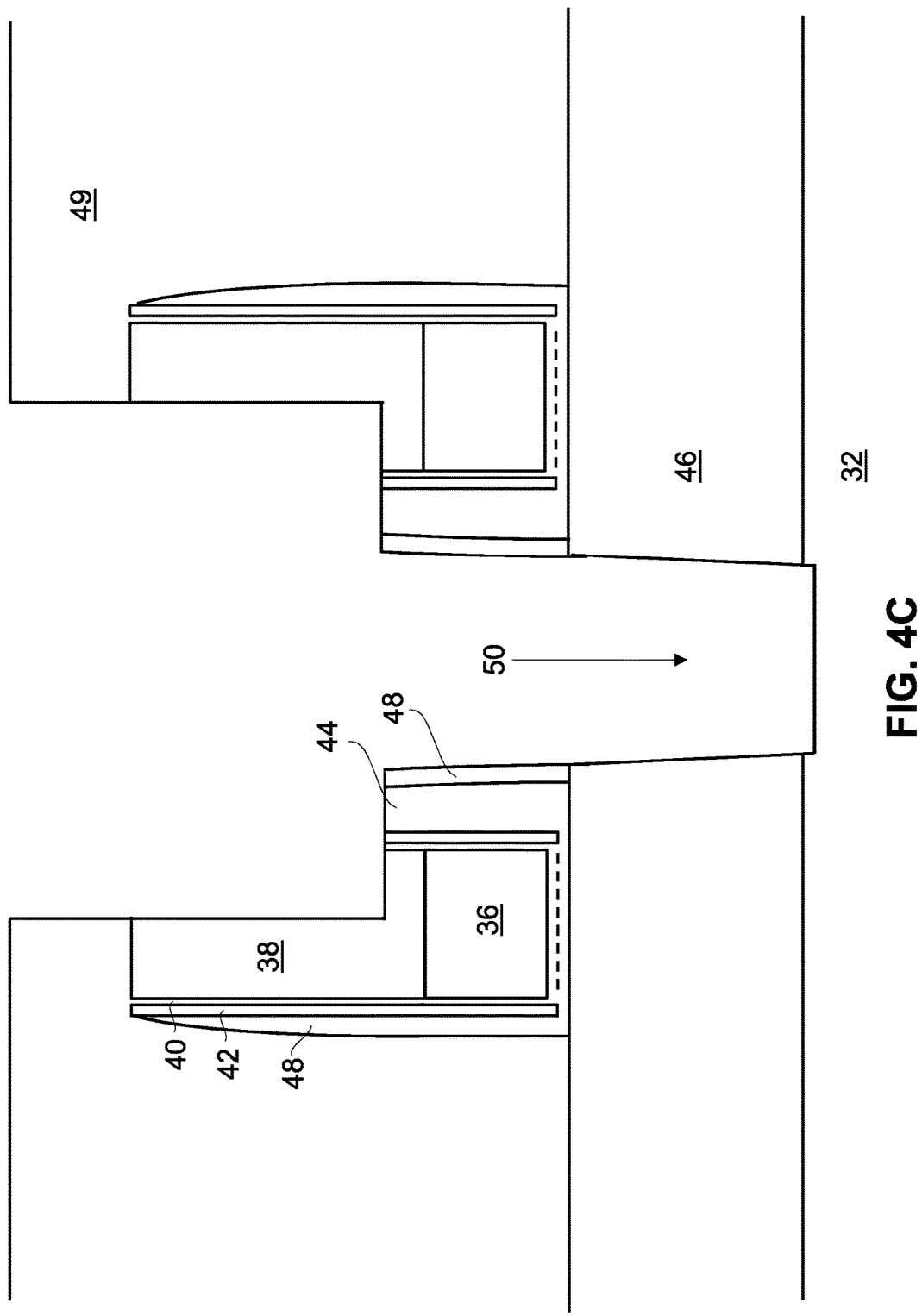

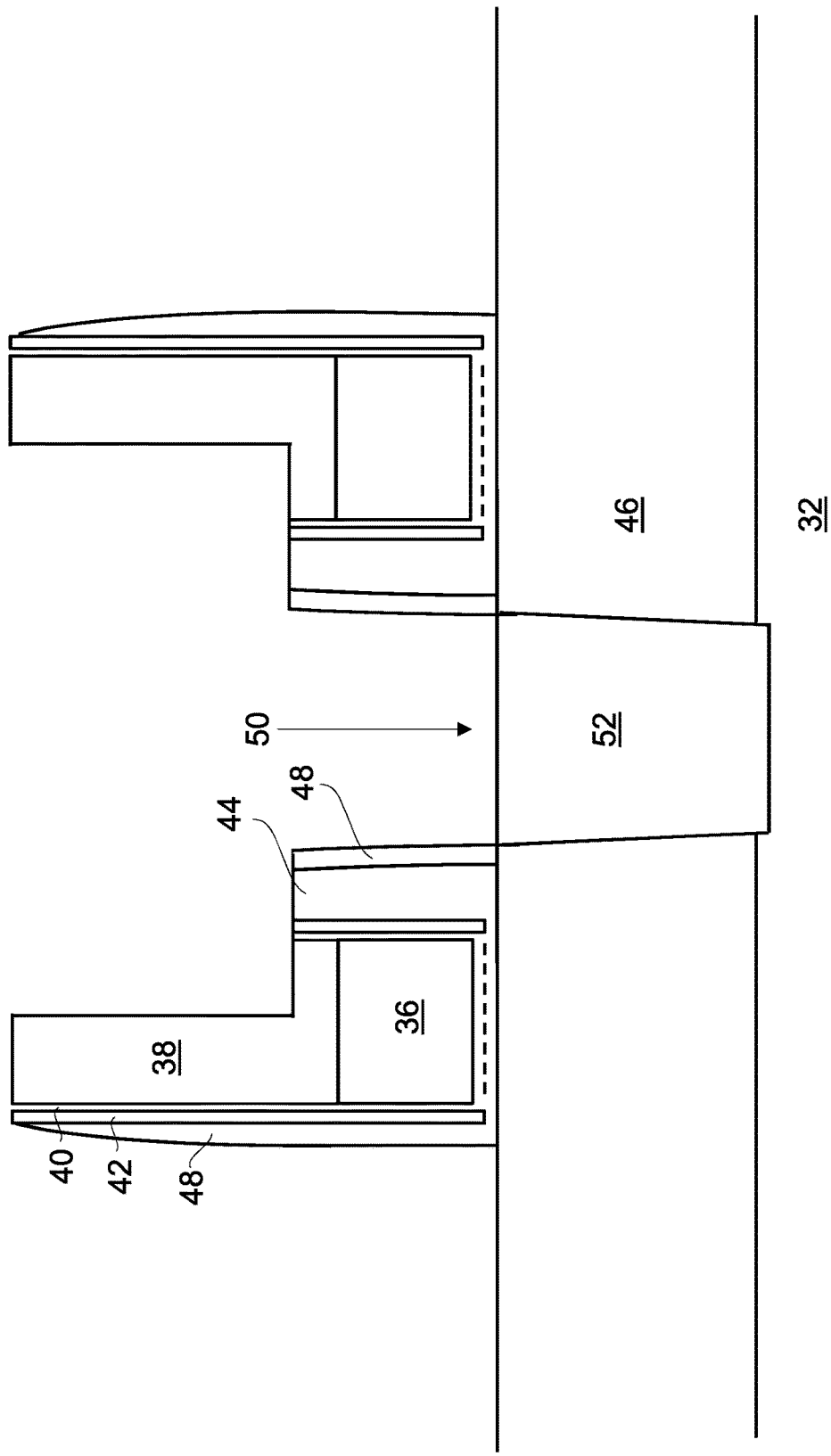

SELF-ALIGNED SOURCE FOR SPLIT-GATE NON-VOLATILE MEMORY CELL

RELATED APPLICATIONS

This application is a divisional of U.S. application Ser. No. 14/319,893, filed Jun. 30, 2014, which claims the benefit of U.S. Provisional Application No. 61/843,189, filed Jul. 5, 2013, both of which are incorporated herein by reference.

FIELD OF THE INVENTION

The present invention relates to fabrication of non-volatile flash memory cells.

BACKGROUND OF THE INVENTION

Split gate non-volatile flash memory cells are known in the art, including those which have a select gate, a floating gate, a control gate, and an erase gate. For example, U.S. Pat. No. 7,927,994, which is incorporated by reference for all purposes, discloses the formation of such memory cells.

FIG. 3L of the '994 patent shows that source region 16 is formed in the substrate between two floating gates, and underneath the erase gate 24. The '994 patent describes and shows (in FIG. 3G) that source region 16 is formed by ion implantation between a pair of gates stacks, with each gate stack including a floating gate, a control gate, insulation layers, and side spacers (including the same side spacers that were used to define the inner sidewalls of the floating gates). The source region implant into the substrate is limited and defined by the inner edges of the opposing floating gates (and the side spacers over the floating gates that were used to define those edges through a polysilicon etch).

FIG. 1 is a top view of the memory array formed using the techniques of the '994 patent. The STI isolation regions 10 are disposed between columns of active regions 12 containing the memory cells. The control gate lines 14 extend parallel to the source lines 16. Spacing 18 between the control gate lines 14 and source lines 16 (i.e. the CG-to-SL spacing 18) must be sufficiently wide to avoid shorting of adjacent floating gates. Spacing 18 depends on alignment between control gate 14 and source line 16. If control gate 14 is miss-aligned to source line 16 in one direction, it will make spacing 18 larger in one side and smaller on another side, and it may lead to leakage between two adjacent floating gates of the smaller CG-to-SL spacing. A sufficient CG-to-SL spacing 18 has to be kept to avoid this leakage from happening. This spacing is difficult to reduce because of miss-alignment issues between the control gate lines 14 and the source line 16. In addition, the width of source line 16 depends on neck space 24, which may vary depending on definition of lithography and the pattern of sophisticated diffusion (active) OPC (optical proximity correction), which often is needed to better define the corner regions 20 of the isolation regions 10, and thus the SL neck area 22 and SL neck space 24, in a controlled way as critical dimensions shrink.

There is a need to form the source regions in a manner that better facilitates scaling down the size of the memory cell array.

BRIEF SUMMARY OF THE INVENTION

The aforementioned problems and needs are addressed by a memory device having a pair of spaced apart conductive floating gates that include inner sidewalls that face each other, wherein the floating gates are disposed over and insulated from a substrate of first conductivity type; a pair of spaced apart conductive control gates each disposed over and insulated from one of the floating gates, wherein each of the control gates includes opposing inner and outer sidewalls, and wherein the inner sidewalls of the control gates face each other; a pair of first spacers of insulation material extending along the inner sidewalls of the control gates and disposed over the floating gates, wherein the inner sidewalls of the floating gates are aligned with side surfaces of the pair of first spacers; a pair of second spacers of insulation material each extending along one of the first spacers and along the inner sidewall of one of the floating gates; a trench formed into the substrate having sidewalls that are aligned with side surfaces of the pair of second spacers; silicon carbon disposed in the trench; and material implanted into the silicon carbon forming a first region therein having a second conductivity type.

Other objects and features of the present invention will become apparent by a review of the specification, claims and appended figures.

BRIEF DESCRIPTION OF THE DRAWINGS

FIG. 1 is a top view illustrating a conventionally formed memory cell array.

FIG. 3A to 3G are side cross sectional views of the active regions, illustrating the steps in forming the memory cell array.

FIG. 4A to 4D are side cross sectional views of the isolation regions, illustrating the steps in forming the memory cell array.

DETAILED DESCRIPTION OF THE INVENTION

The present invention is an improved technique for forming the source regions such that minimal CG-to-SL diffusion spacing is used (which allows for smaller memory cell sizes), the critical dimension of the source line can be better controlled, and no OPC is needed for the SL neck area.

Figure 2B:
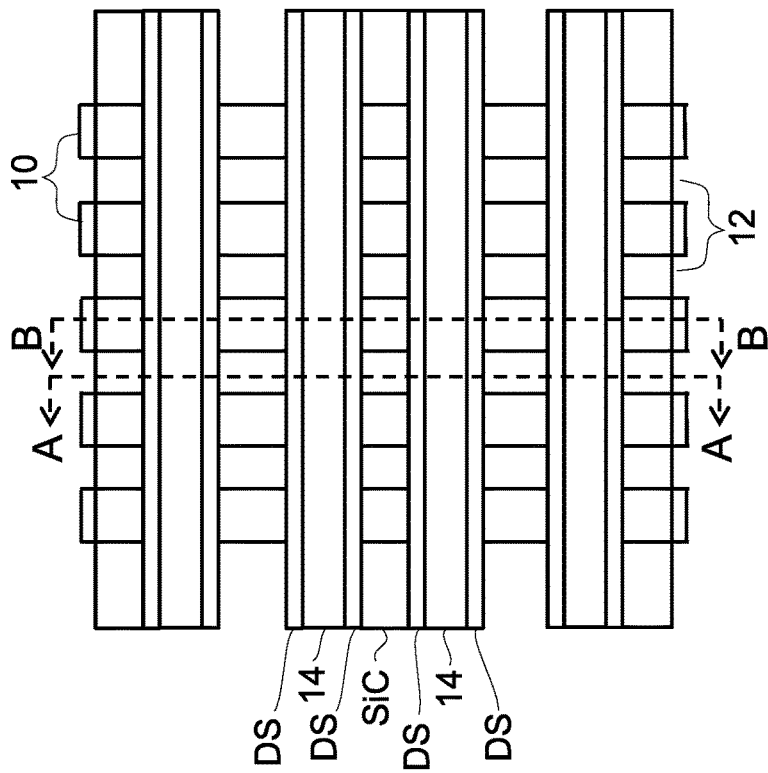
FIGS. 2A and 2B are top views illustrating the dielectric spacer DS and silicon carbon (SiC) used in the memory cell array of the present invention.
Figure 2A:
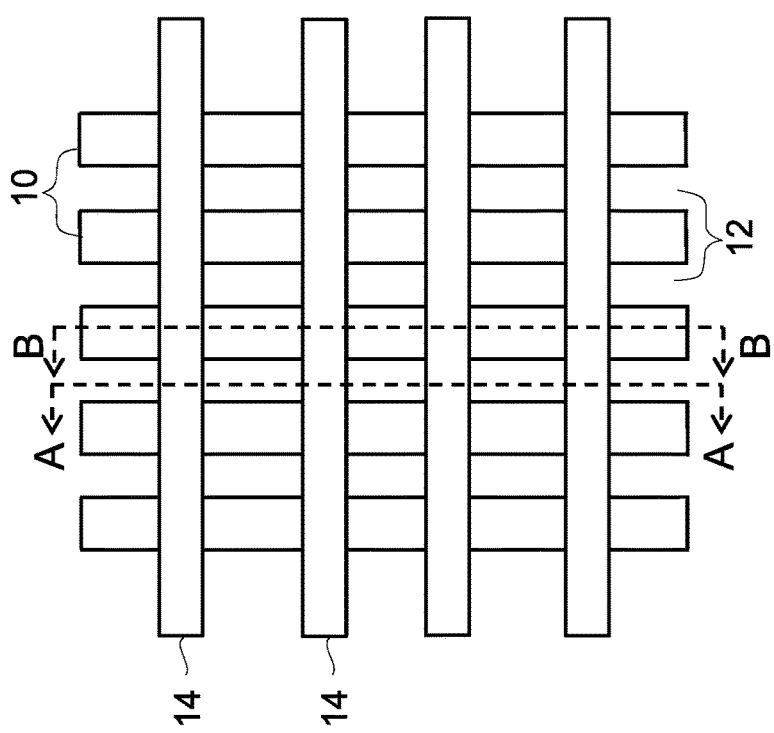

FIGS. 2A and 2B illustrate key features of the present invention, which include the formation of a dielectric spacer DS on the control gate and floating gate sidewalls (different from the spacer used to define the floating gate sidewall in the '994 patent) before the source lines are formed, and selective epitaxial growth of silicon carbon (SiC) in trenches in the silicon substrate and STI oxide isolation region where the substrate silicon is exposed at the bottom. FIG. 2A illustrates the array after control gate formation, but before source line formation. FIG. 2B illustrates the array after a control gate sidewall spacer DS is formed, and after silicon carbon is grown in trenches in the source line region.

Figure 3A:
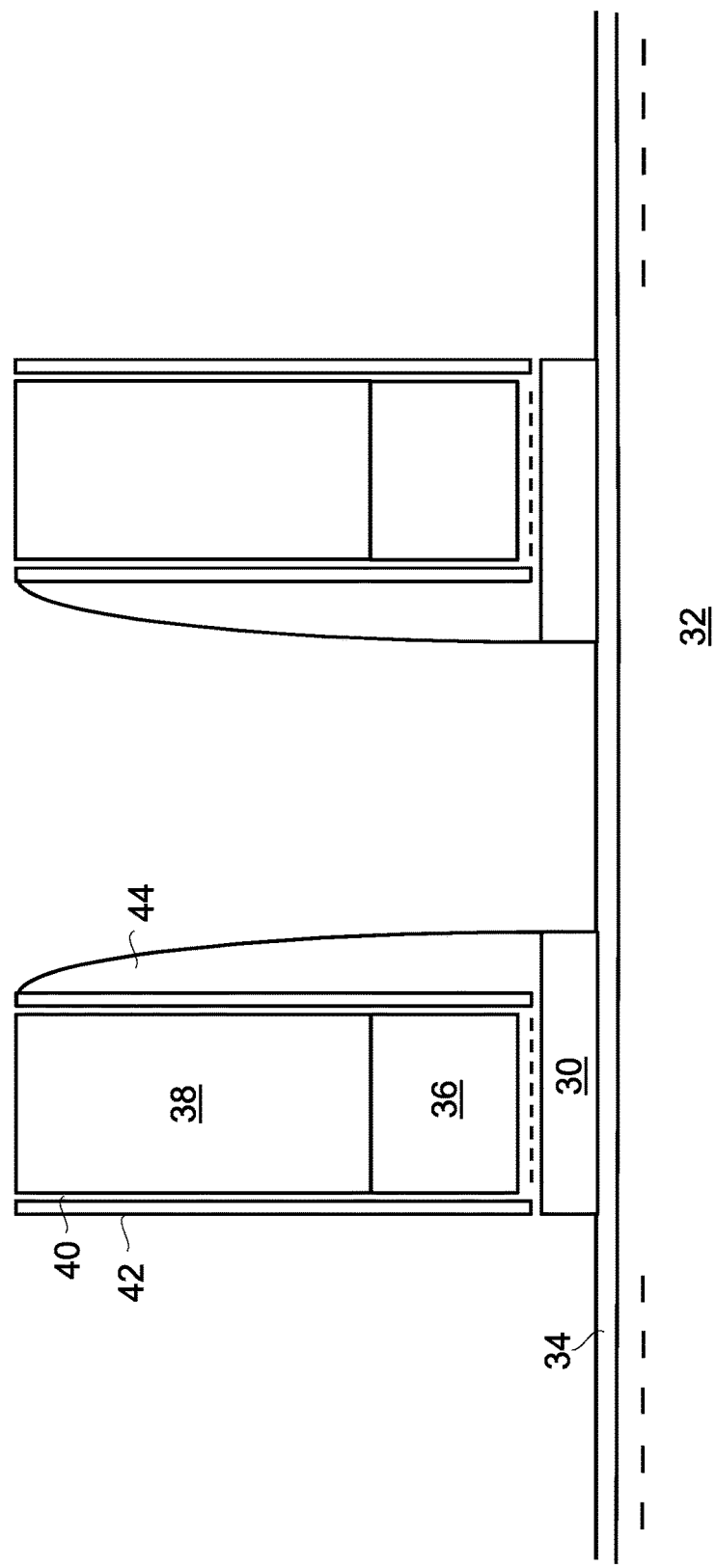

FIG. 3A-3G are cross sectional views taken along the line A-A (in the active region), and FIG. 4A-4D are cross sectional views taken along the line B-B (in the isolation region), as shown in FIGS. 2A and 2B, illustrating the steps in forming the memory array. FIG. 3A corresponds to a structure similar to that of FIG. 3G in the '994 patent, but before the implant that forms the source region. Floating gates 30 are formed on a silicon substrate 32 and insulated therefrom by an insulation layer 34 (e.g. silicon dioxide). A control gate 36 is formed over and insulated from each of the floating gates 30. The control gates 36 have inner sidewalls 36a that face each other. An insulator 38 (also referred to as a hard mask insulator) is formed over each control gate 36. Silicon dioxide 40 and silicon nitride 42 are formed on the sides of control gates 36 and insulator 38. Oxide spacers 44 are formed along the sides (including inner sidewalls 36a) of the control gates 36 and insulator 38. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (with a rounded upper surface). A poly etch has been performed that uses spacers 44 to define the inner sidewalls 30a of the floating gates 30 that face each other. FIG. 4A shows the structure in the isolation region 10, which is formed over STI insulation 46 (e.g. silicon dioxide). The structure lacks floating gates 30 in the isolation regions 10.

Oxide spacers 48 are then formed on the sides of the structure (by oxide deposition and oxide anisotropic etch), as shown in FIGS. 3B and 4B. Spacers 48 in the inner facing regions extend along spacer 44 and along the inner facing surfaces 30a of floating gates 30. Preferably a time-mode (fixed-time) etch is used in the formation of the spacers, to leave a layer of oxide 47 on the substrate 32. Photo-resist 49 is formed over the outer half of each structure (i.e. over only a portion of hard mask insulator 38) by photo-resist coating and photolithographic exposure and develop. Silicon, nitride and oxide etches are used to etch down the exposed portions of hard mask insulator 38, spacers 44 and 48, nitride 42 and oxide 40, as well as form a trench 50 into the silicon substrate 32 in the active regions and into the STI insulation 46 in the isolation regions. For example, performing an etch that switches gasses between silicon, nitride and oxide etches part way through can achieve the desired result, with an exemplary trench depth of 1000 Å to 1500 Å in both the active and isolation regions. The resulting structure is shown in FIGS. 3C and 4C.

Figure 3D:
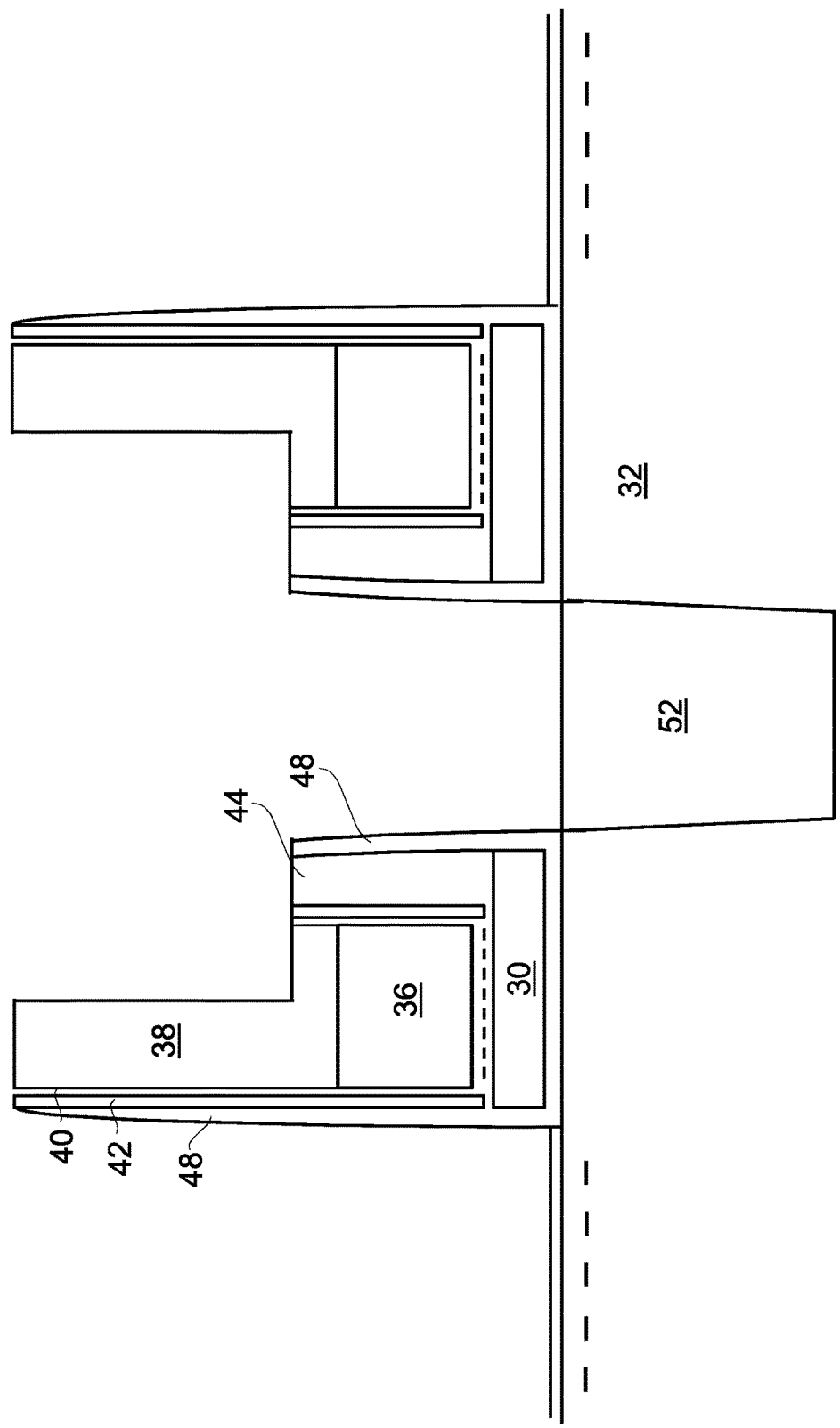

The photo resist 49 is then removed. An epitaxial growth is carried out at low temperature (e.g. between 450° C. to 600° C.) to grow a silicon carbon layer 52 in the trenches 50 (i.e. grown from the bottom up) until the trenches 50 are substantially filled, as shown in FIGS. 3D and 4D.

Figure 3E:
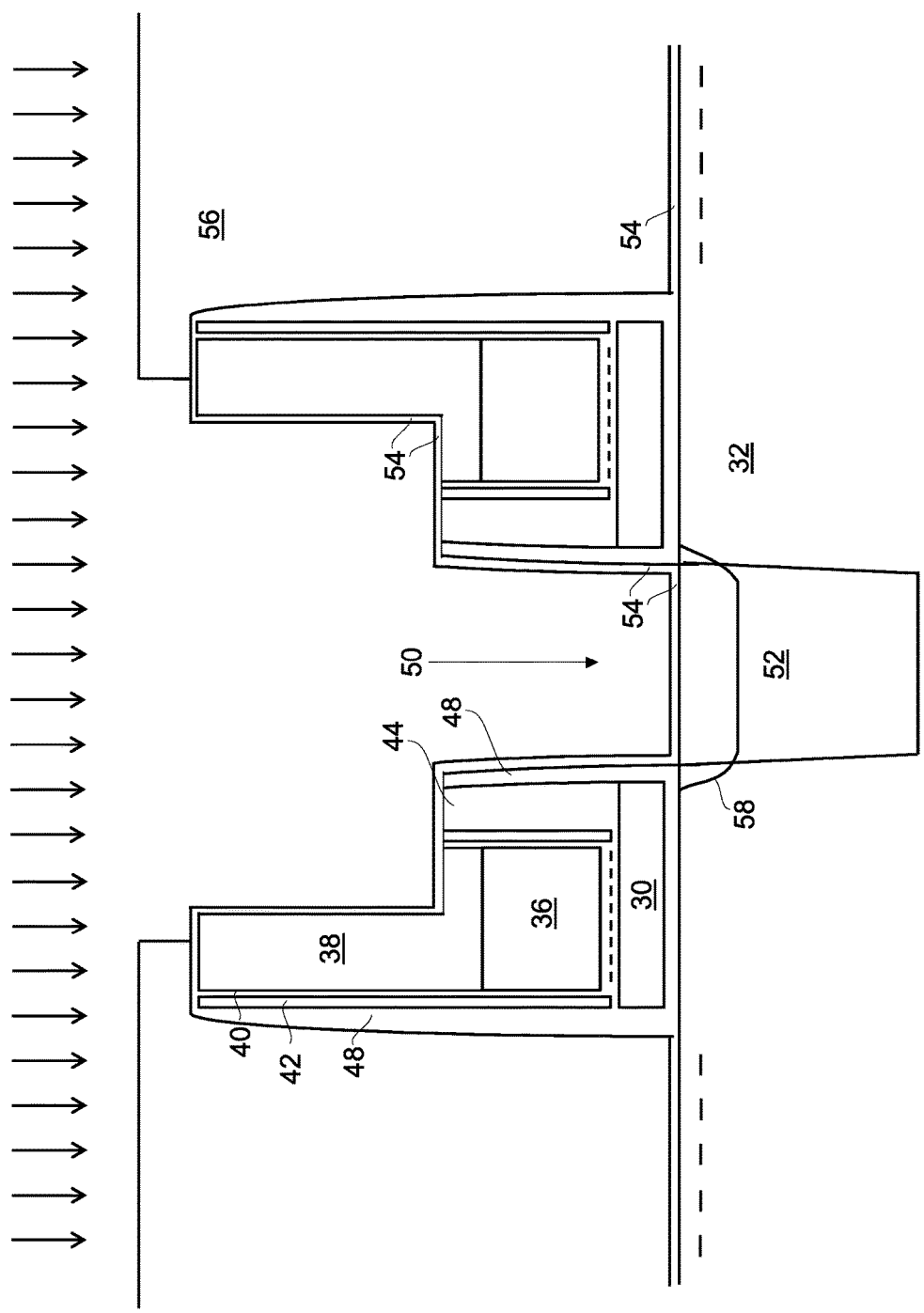

An oxide deposition is next performed to form an oxide layer 54 on the structure. Photo resist 56 is formed over the structure and patterned to expose the inner portions of the structure. A source-line implant (as indicated by the arrows) is then performed into the SiC (between spacers 48 and oxide layer 54 formed thereon), followed by an anneal which diffuses N+ implant dopant to form the final source region 58, as shown in FIG. 3E.

Figure 3F:
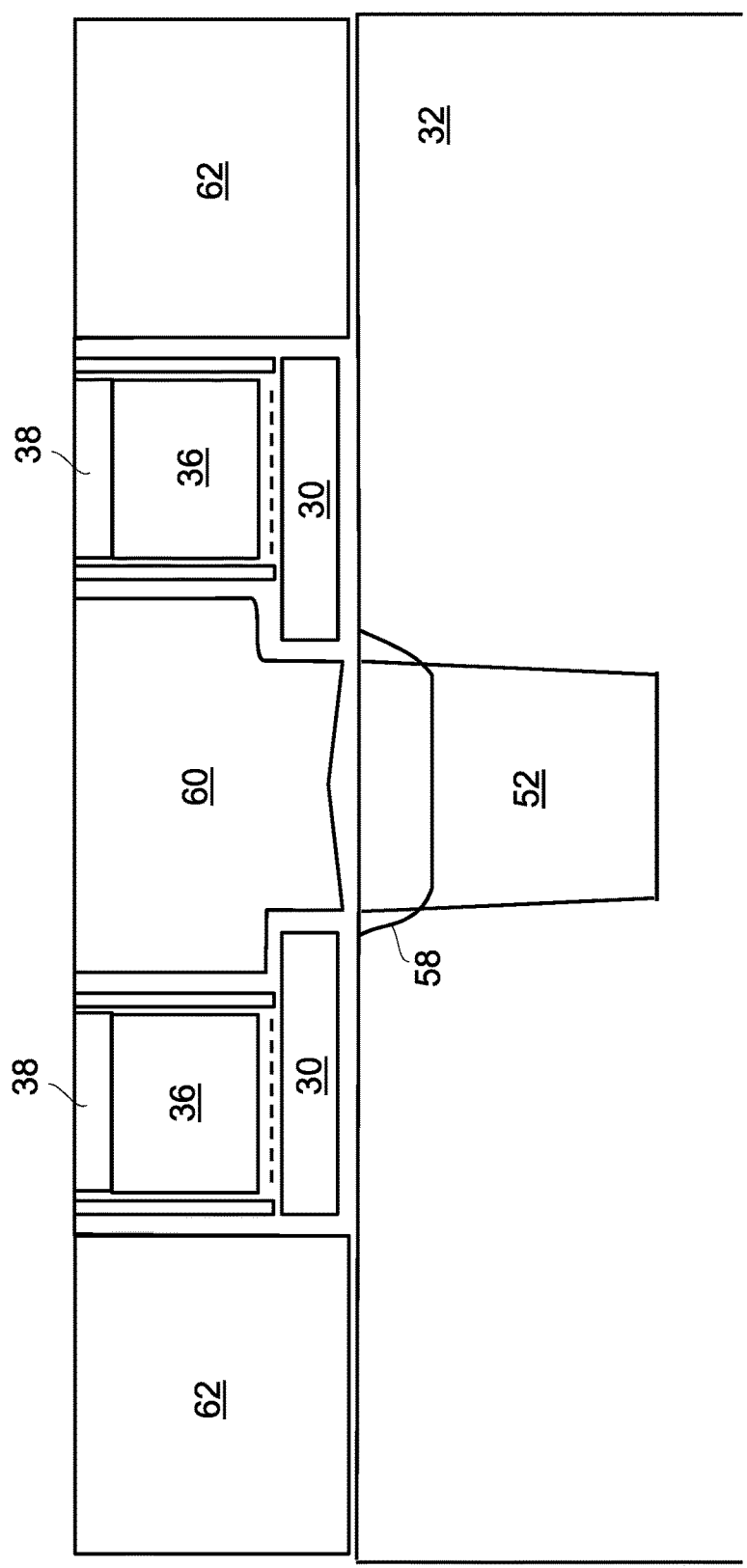

Photo resist 56 is removed. A polysilicon deposition, and CMP (chemical mechanical polish) of the polysilicon and the hard mask insulator 38, are used to form the erase gate 60 between the pair of control gates 36, and the word line gates 62 on the outside of the control gates 36, as illustrated in FIG. 3F. A subsequent implant step is performed to form drain regions 64 in substrate 32 adjacent the outer sidewalls of word-line gates 62, followed by the formation of additional insulator and metallization layers deposition and patterning to form bit line contacts 66. The final structure is shown in FIG. 3G.

The source region formation technique is advantageous because the dielectric spacers 48 (separate from spacers 44 used to define the inner floating gate edges) defines a narrower space in which trenches 50 are formed and in which the source implant penetrates into the silicon carbon 52. The silicon carbon is selectively grown in the silicon trenches followed by source implant and anneal to form the self-aligned source line. The epitaxial growth temperature of silicon carbon (SiC) is much lower than that of the conventional silicon (Si). The much lower thermal budget of silicon carbon minimizes the impact of implant dopant re-distribution of the logic devices, which are fabricated prior to silicon carbon growth. The spacers 48 together with the silicon carbon 52 allow for enhanced control over (and increased relative value of) the CG-to-SL spacing. The CG-to-SL spacing of this invention will be no longer depending on CG to SL alignment as in the conventional flash memory cells.

It is to be understood that the present invention is not limited to the embodiment(s) described above and illustrated herein, but encompasses any and all inherent variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Lastly, single layers of material could be formed as multiple layers of such or similar materials, and vice versa.

It should be noted that, as used herein, the terms "over," "on," and "along" each inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between). For example, forming an element "over a substrate" or "along a substrate" can include forming the element directly on the substrate with no intermediate materials/elements therebetween, as well as forming the element indirectly on the substrate with one or more intermediate materials/elements therebetween.

What is claimed is:

1. A memory device, comprising:
    a pair of spaced apart conductive floating gates that include inner sidewalls that face each other, wherein the floating gates are disposed over and insulated from a substrate of first conductivity type;
    a pair of spaced apart conductive control gates each disposed over and insulated from one of the floating gates, wherein each of the control gates includes opposing inner and outer sidewalls, and wherein the inner sidewalls of the control gates face each other;
    a pair of first spacers of insulation material extending along the inner sidewalls of the control gates and disposed over the floating gates, wherein the inner sidewalls of the floating gates are aligned with side surfaces of the pair of first spacers;
    a pair of second spacers of insulation material each extending along one of the first spacers and along the inner sidewall of one of the floating gates;
    a trench formed into the substrate having sidewalls that are aligned with side surfaces of the pair of second spacers;
    silicon carbon disposed in the trench; and
    material implanted into the silicon carbon forming a first region therein having a second conductivity type.

2. The memory device of claim 1, further comprising:
    a pair of blocks of insulation material each disposed over one of the control gates, wherein each of the first and second spacers extend at least partially along one of the blocks of insulation material.

3. The memory device of claim 1, further comprising:
silicon dioxide and silicon nitride disposed between each of the control gates and one of the pair of first spacers.

4. The memory device of claim 1, further comprising:
an erase gate of conductive material disposed over and insulated from the first region.

5. The memory device of claim 1, further comprising:
a pair of wordline gates each disposed adjacent to and insulated from one of the outer sidewalls and the substrate.

* * * * *